(12) United States Patent
Cleeves (10) Patent No.: US 7,691,691 B1
(45) Date of Patent: Apr. 6, 2010

(54) SEMICONDUCTOR DEVICE AND METHODS FOR MAKING THE SAME

(75) Inventor: James Montague Cleeves, Redwood City, CA (US)

(73) Assignee: Kovio, Inc., Milpitas, CA (US)

( * ) Notice: Subject to any disclaimer, the term of this patent is extended or adjusted under 35 U.S.C. 154(b) by 180 days.

(21) Appl. No.: 11/805,620

(22) Filed: May 23, 2007

Related U.S. Application Data (60) Provisional application No. 60/802,968, filed on May 23, 2006.

(51) Int. Cl.
*H01L 21/00* (2006.01)

(52) U.S. Cl. ............... 438/163; 438/296; 438/301; 438/305; 438/306; 257/408; 257/E21.413; 257/E29.278

(58) Field of Classification Search ............ 438/163, 438/296, 301, 305, 306; 257/408, E21.413, 257/E29.278
See application file for complete search history.

(56) References Cited

U.S. PATENT DOCUMENTS

| | | | |
|---|---|---|---|
| 5,132,248 | A | 7/1992 | Drummond et al. |
| 5,612,235 | A | 3/1997 | Wu et al. |
| 5,821,137 | A | 10/1998 | Wakai et al. |
| 5,989,944 | A | 11/1999 | Yoon |
| 6,245,602 | B1 | 6/2001 | Ho et al. |
| 6,323,069 | B1 | 11/2001 | Yamazaki et al. |
| 6,509,217 | B1 | 1/2003 | Reddy |
| 6,511,870 | B2 | 1/2003 | Chen et al. |
| 6,511,910 | B2 | 1/2003 | Asahina et al. |
| 6,514,801 | B1 | 2/2003 | Yudasaka et al. |
| 6,517,911 | B1 | 2/2003 | Matsuki |
| 6,518,087 | B1 | 2/2003 | Furusawa et al. |
| 6,562,670 | B2 * | 5/2003 | Shih ............... 438/160 |
| 6,593,591 | B2 | 7/2003 | Yudasaka et al. |
| 6,767,775 | B1 * | 7/2004 | Yudasaka et al. ........... 438/156 |

(Continued)

FOREIGN PATENT DOCUMENTS

EP 1 113 502 A1 7/2001

(Continued)

OTHER PUBLICATIONS

Kazuo Yudasaka, Masahiro Furusawa, Takashi Aoki; Device, Its Manufacturing Method and Electronic Device; Publication No. 2003318193 A: Publication Date Nov. 7, 2003; Patent Abstracts of Japan; Japanese Patent Office, Japan.

(Continued)

*Primary Examiner*—Andy Huynh
(74) *Attorney, Agent, or Firm*—The Law Offices of Andrew D. Fortney; Andrew D. Fortney; William E. Brow (57) ABSTRACT

Thin film transistors (TFT) and methods for making same. The TFTs generally comprise: (a) a semiconductor layer comprising source and drain terminals and a channel region therebetween; (b) a gate electrode comprising a gate and a gate dielectric layer between the gate and the channel region; (c) a first dielectric layer adjacent to the gate electrode and in contact with the source and drain terminals, the first dielectric layer comprising a material which comprises a dopant therein; and (d) an electrically functional source/drain extensions in the channel region, adjacent to the source and drain terminals, comprising a material which comprises the same dopant as the first dielectric layer.

32 Claims, 4 Drawing Sheets

U.S. PATENT DOCUMENTS

| | | |
|---|---|---|
| 6,812,111 B2 * | 11/2004 | Cheong et al. .............. 438/396 |
| 6,858,907 B2 * | 2/2005 | Ryu et al. ................... 257/412 |
| 6,864,133 B2 | 3/2005 | Aoki et al. |
| 6,884,700 B2 * | 4/2005 | Aoki et al. ................. 438/502 |
| 6,908,796 B2 | 6/2005 | Furusawa |
| 6,917,072 B2 | 7/2005 | Noguchi et al. |
| 7,052,980 B2 | 5/2006 | Aoki |
| 2002/0053671 A1 | 5/2002 | Koyama |
| 2002/0074547 A1 | 6/2002 | Yudasaka et al. |
| 2002/0179906 A1 | 12/2002 | Yudasaka et al. |
| 2003/0042559 A1 | 3/2003 | Takemura et al. |
| 2003/0134519 A1 | 7/2003 | Yudasaka et al. |
| 2004/0029364 A1 | 2/2004 | Aoki et al. |
| 2004/0092075 A1 * | 5/2004 | Yeo et al. .................... 438/305 |
| 2004/0248429 A1 | 12/2004 | Aoki |
| 2005/0133790 A1 | 6/2005 | Kato |
| 2005/0134463 A1 | 6/2005 | Yamazaki |
| 2005/0148121 A1 | 7/2005 | Yamazaki et al. |
| 2005/0176183 A1 | 8/2005 | Aoki |
| 2005/0181566 A1 | 8/2005 | Machida et al. |
| 2006/0008956 A1 | 1/2006 | Yudasaka et al. |

FOREIGN PATENT DOCUMENTS

| | | |
|---|---|---|
| WO | WO 00/59041 | 10/2000 |

OTHER PUBLICATIONS

Zhibin Ziong, Haitao Liu, Chunxiang Zhu, Johnny K. O. Sin; A Novel Self-Aligned Offset-Gated Polysilicon TFT Using High-κ Dielectric Spacers; IEEE Electron Device Letters; Apr. 2004; 2 pages; vol. 25, No. 4.

* cited by examiner

SEMICONDUCTOR DEVICE AND METHODS FOR MAKING THE SAME

RELATED APPLICATIONS

This application claims the benefit of U.S. Provisional Application No. 60/802,968, filed May 23, 2006, incorporated herein by reference in its entirety.

FIELD OF THE INVENTION

The present invention generally relates to the field of thin film transistors (TFT) and processes for manufacturing the same.

BACKGROUND OF THE INVENTION

A thin film transistor (TFT) is a type of field effect transistor manufactured by depositing thin films for the metallic contacts, semiconductor active layer, and dielectric layer. The channel region of a TFT is a thin film that is deposited onto a substrate. The substrate is usually glass, since an important application of TFTs is in liquid crystal displays (LCDs). Thin film transistor LCDs, a variant of LCD technology, are especially useful in cellular phone display and LCD televisions. In such devices, the TFTs are embedded within the panel itself, reducing crosstalk between pixels and improving image stability. TFT panels are also heavily used in digital radiography applications including mammography and general radiography.

Traditionally, gate induced drain leakage problems in some transistor devices are typically overcome by using spacer technology and a graded drain junction. However, in many process technologies (including some thin film technologies and printing technologies), processes for forming spacers are not readily available, and processes for forming graded junctions may be relatively complex. It may thus be advantageous to have a process for forming graded junctions that is relatively simple and/or facile to use.

SUMMARY OF THE INVENTION

Embodiments of the present invention relate to a thin film transistor (TFT) device and a method for making the same.

The method generally relates to a method of making source/drain (S/D) tip extensions in a thin film transistor (TFT), and comprises the steps of: (a) forming a first dielectric layer adjacent to a gate electrode and in contact with source and drain terminals of the TFT, the gate electrode having a gate dielectric layer between a gate and a channel region of the TFT, and the first dielectric layer having a dopant therein; and (b) heating the resulting structure sufficiently to diffuse an amount of the dopant from the first dielectric layer into the channel region effective to form electrically functional source/drain extensions.

In a first set of representative embodiments of the method, the gate dielectric layer is recessed under the gate. The method can further comprise etching the gate dielectric layer to form an undercut space between an outer edge region of the gate and the channel region. The first dielectric layer can fill the undercut space. Also, in one embodiment, the undercut space can be less than or equal to 10% of the gate length. The undercut region can be formed, for example, by wet etching the gate dielectric layer. In addition, the gate can comprise a material that is not significantly etched under the wet etching conditions.

In a second set of representative embodiments of the method, the first dielectric layer has a dielectric constant (k) less than that of the gate dielectric layer. The gate dielectric layer can comprise one or more materials such as silicon nitride, aluminum oxide, hafnium monoxide and/or hafnium dioxide. The first dielectric layer can comprise a material such as silicon dioxide doped with boron or phosphorous, or a polyimide.

In a third set of representative embodiments of the method, forming the first dielectric layer comprises chemical vapor depositing the first dielectric layer. In an alternative fourth set of representative embodiments of the method, the formation of the first dielectric layer comprises spin-on depositing a precursor to the first dielectric layer, then converting the precursor to the first dielectric layer. The precursor can comprise a spin-on glass having wetting characteristics sufficient to form a fillet at the base of the gate.

In a fifth set of representative embodiments of the method, the first dielectric layer comprises a lightly doped dielectric layer. The method can also comprise forming a heavily doped dielectric layer over or in contact with the lightly doped dielectric layer.

In a sixth set of representative embodiments, the method further comprises removing the first dielectric layer, then forming a heavily doped dielectric layer over or in contact with the gate and the source and drain terminals.

In a first set of representative embodiments of the TFT, the TFT comprises: (a) a semiconductor layer comprising source and drain terminals and a channel region therebetween; (b) a gate electrode comprising a gate and a gate dielectric layer between the gate and the channel region; (c) a first dielectric layer adjacent to the gate electrode and in contact with the source and drain terminals, the first dielectric layer having a dopant therein; and (d) electrically functional source/drain extensions in the channel region, adjacent to the source and drain terminals, comprising the same dopant as the first dielectric layer.

In a second set of representative embodiments of the TFT, the first dielectric layer comprises a lightly doped dielectric layer.

In a third set of representative embodiments of the TFT, the TFT further comprises a heavily doped dielectric layer over or in contact with the lightly doped dielectric layer.

In a fourth set of representative embodiments of the TFT, the TFT comprises a recess in the gate dielectric layer under at least one edge of the gate. Also, the first dielectric layer can fill the recess. In various embodiments, the recess can have a length less than or equal to 10% of the gate length.

In a fifth set of representative embodiments of the TFT, the first dielectric layer has a dielectric constant (k) less than that of the gate dielectric layer. Optionally, the gate dielectric layer can comprise one or more materials such as silicon nitride, aluminum oxide, hafnium monoxide and/or hafnium dioxide. Also, the first dielectric layer can comprise materials such as silicon dioxide doped with boron or phosphorous, and polyimides.

In a sixth set of representative embodiments of the TFT, the gate comprises molybdenum, and the first dielectric layer comprises a CVD silicon oxide (e.g., a silicon oxide formed by chemical vapor deposition from a precursor, such as silane (in the presence of an oxygen source or tetraethyl orthosilicate (TEOS)).

In a seventh set of representative embodiments of the TFT, the formation of the first dielectric layer comprises a spin-on glass. Optionally, the spin-on glass is formed from a precursor having wetting characteristics sufficient to form a fillet at the base of the gate.

Also provided are devices incorporating the semiconductor structures of the present invention. The devices may include a radio frequency identification (RFID) tag, a high frequency (HF) device, an ultrahigh frequency (UHF) device, etc., all of which employ circuitry for signal modulation, signal demodulation, rectification, clock generation and/or recovery, logic/signal processing, and/or memory (see, e.g., U.S. patent application Ser. No. 11/452,108, filed on Jun. 12, 2006. Furthermore, such a device may be incorporated in or attached to another object, for example a computer, mobile phone, a book, a container, or an automobile.

BRIEF DESCRIPTION OF THE DRAWINGS

FIGS. 1-5 illustrate an exemplary process for making a TFT according to the present invention; FIG. 5 also illustrates an exemplary TFT comprising a gate metal over a high dielectric constant gate dielectric that has been intentionally recessed under the gate.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The invention, in its various aspects, will be explained in greater detail below with regard to exemplary embodiments.

An Exemplary Process for Manufacturing TFTs

Figure 1:
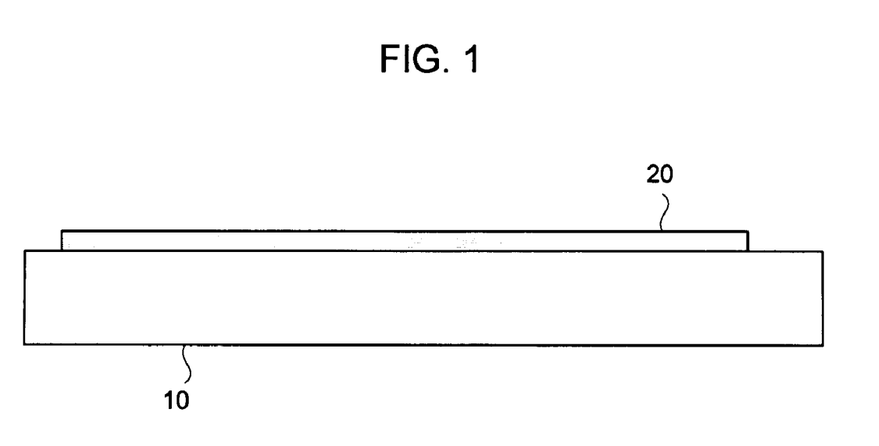

As illustrated in FIG. 1, a channel layer 20 is deposited on substrate 10. Channel layer 20 generally comprises a semiconductor material, such as silicon, germanium, a silicon-germanium mixture or alloy, a III-V semiconductor (such as GaAs), a II-VI semiconductor (such as CdSe or ZnS), or an organic semiconductor. Preferably, channel layer 20 comprises a Group IVA element, such as silicon, germanium, or silicon-germanium. Channel layer 20 may be blanket-deposited (e.g., by evaporation, chemical vapor deposition [CVD] from suitable precursors, etc.) and patterned by relatively low-resolution photolithography, or more preferably, printed from a suitable precursor ink. Typically, although not necessarily always, a liquid-phase semiconductor ink comprises a precursor compound and a solvent, preferably a cycloalkane solvent. When using an ink comprising or consisting essentially of a Group IVA element source (such as a silane-based precursor to Si or doped Si), forming the channel layer 20 may further comprise irradiating the ink after or (preferably) during deposition of the ink, drying the liquid-phase precursor ink after deposition (and optional irradiation), annealing to form a hydrogenated, amorphous Group IVA element (e.g., a-Si:H), and crystallization (preferably by laser irradiation with an appropriate wavelength of light). See copending U.S. application Ser. Nos. 10/616,147, 10/789,317 and 10/789,274, respectively filed Jul. 8, 2003, Feb. 27, 2004 and Feb. 27, 2004, the relevant portions of each of which are incorporated herein by reference.

Representative cyclosilane compounds of the formula $(AH_z)_k$ wherein A is Si, z is 1 or 2 (preferably 2) and k is from 3 to 12 (preferably 4 to 8) and an exemplary method for their preparation are described in greater detail in copending application Ser. No. 10/789,317, filed Feb. 27, 2004, the relevant portions of which are incorporated herein by reference. Representative hetero(cyclo)silane compounds, doped silane intermediates, exemplary methods for their preparation, and techniques for determining and/or controlling the dopant levels in the precursor inks and active films are described in greater detail in copending application Ser. Nos. 10/950,373, 10/949,013 and 10/956,714, respectively filed on Sep. 24, 2004, Sep. 24, 2004 and Oct. 1, 2004, the relevant portions of which are incorporated herein by reference. Representative oligo- and polysilane compounds are disclosed in U.S. Provisional Appl. Nos. 60/850,094 and 60/905,403, filed Oct. 6, 2006 and Mar. 5, 2007, respectively, the relevant portions of which are incorporated herein by reference.

The channel layer 20 may have a width (e.g., the longest dimension shown in the cross-section of FIG. 1) of at least 5, 8 or 10 μm, up to 20, 50 or 100 μm or more, or any range of values therein. The channel layer 20 may have a length (e.g., the dimension normal to the plane of the page in FIG. 1) of at least 5, 10 or 20 μm, up to 50, 100, or 200 μm or more, or any range of values therein. A typical thickness for the channel layer 20 may be from 10 to 1000 nm or any range of values therein (e.g., from 20, 25, 30, 75 or 100 nm to 200, 250, 300, 500 or 1000 μm). The film thickness may be chosen to optimize the electrical properties of the thin film transistor.

Figure 2:
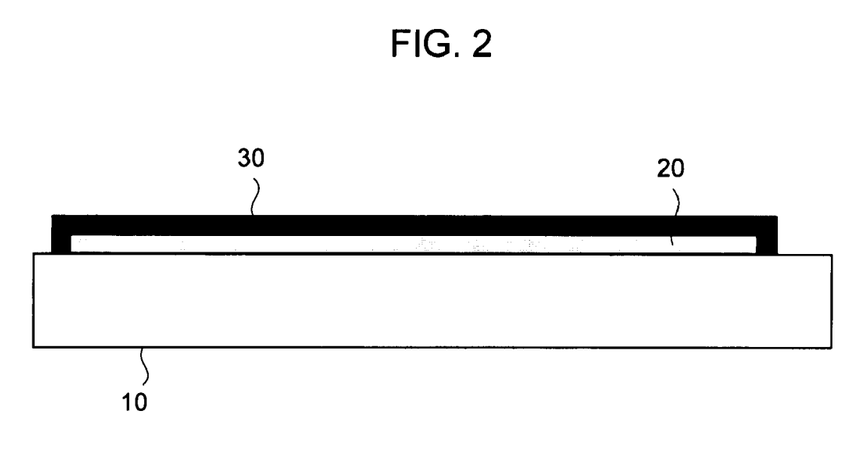
Figure 3:
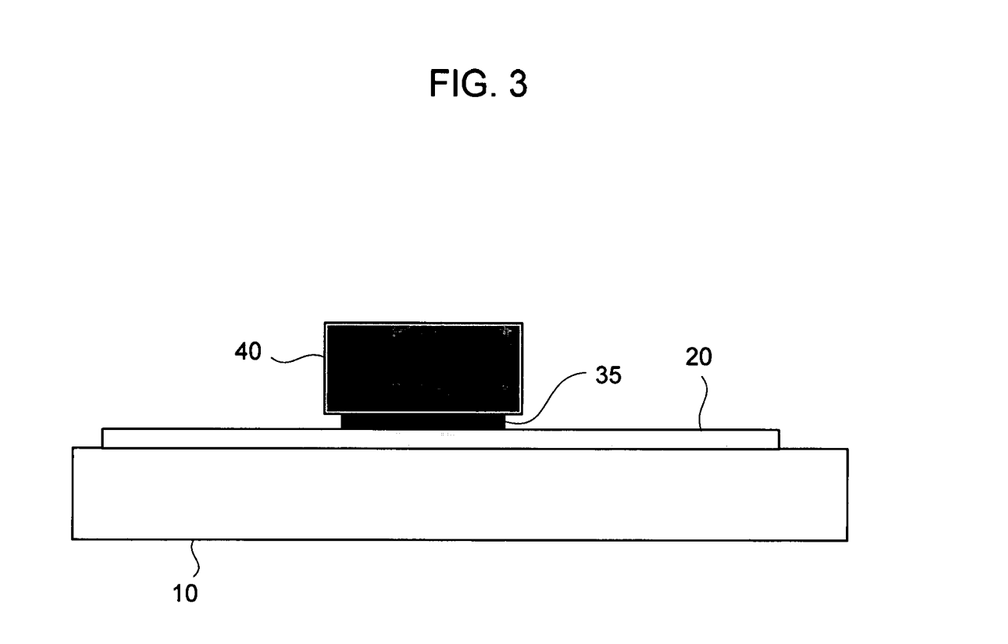
Figure 4:
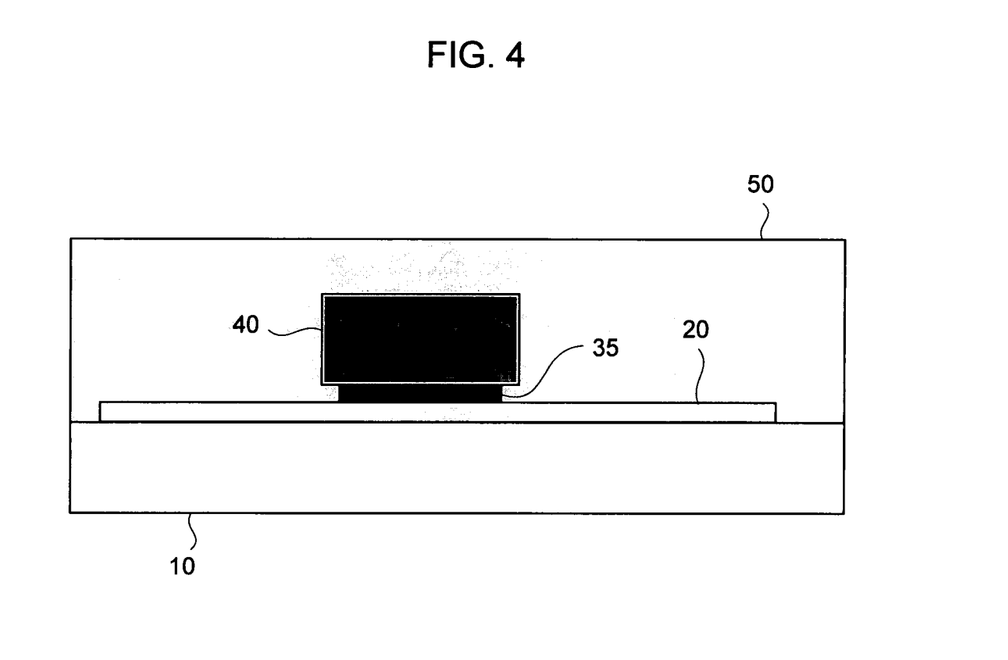

Gate dielectric layer 30 is then deposited on layer 20 or grown by wet or dry thermal oxidation, as depicted in FIG. 2. Thus, when channel layer 20 comprises or consists essentially of (doped) silicon, the material of the gate dielectric layer 30 may comprise thermally grown $SiO_2$, as shown in FIG. 2. However, more preferably, gate dielectric layer 30 comprises one or more high dielectric constant materials deposited by blanket deposition (e.g., CVD, or evaporation or sputtering followed by conventional oxidation and/or nitridation), for example silicon nitride, aluminum oxide, hafnium monoxide and/or hafnium dioxide, $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_y$, $SiAlO_xN_{1-x-y}$, $HfSiAlO_x$, $HfSiAlO_xN_y$, $ZrSiAlO_x$, $ZrSiAlO_xN_y$, a combination thereof, or a combination thereof with $SiO_2$. The Subsequently, as shown in FIG. 3, gate 40 is formed, by blanket deposition (e.g., as described above) and patterning (e.g., by photolithography), or more preferably, by printing from a suitable precursor ink. The gate metal may be printed by depositing a suitable gate metal precursor (e.g. metal nanoparticles or organometallic compound(s), doped molecular and/or nanoparticle-based silicon ink(s), metal silicide precursor ink(s), etc.), then converting it to a gate metal, typically by annealing or laser writing (see copending U.S. application Ser. No. 11/203,563, filed on Aug. 11, 2005, the relevant portions of which are incorporated herein by reference). Thus, the ink may comprise or consist essentially of the metal precursor material and a solvent. The metal precursors that are generally compatible with printing or (selectively) plating may comprise organometallic compounds or nanoparticles (e.g., nanocrystals) of a metal such as titanium, copper, silver, chromium, molybdenum, tungsten, cobalt, nickel, gold, palladium, platinum, zinc, iron, etc., or metal alloys thereof. Such nanoparticles or nanocrystals may be conventionally passivated (e.g., with one or more surfactants) or unpassivated. Use of doped silicon inks for gate 40 may further require a high temperature anneal or laser irradiation to form polycrystalline silicon and/or to activate the dopant to achieve sufficient conductivity. Alternatively, a precursor metal (e.g., Pd) for a seed layer may be printed and annealed in an inert or reducing atmosphere (and optionally, laser written using nanoparticles or an organometallic compound of the metal, then selectively depositing (e.g., by electroless or electroplating) a bulk conductor (e.g., Co, Ni, Cu, etc.) or semiconductor (e.g., Si and/or Ge) onto the seed layer. Annealing and/or laser writing the seed layer may also activate the metal before the plating process.

In various embodiments, the gate 40 comprises a metal silicide selected from the group consisting of nickel silicide, cobalt silicide, palladium silicide, platinum silicide, titanium silicide, tungsten silicide, and molybdenum silicide. In other embodiments, the gate 40 comprises a refractory metal selected from the group consisting of palladium, tungsten, and molybdenum. In one representative embodiment, the gate 40 comprises one or more materials compatible with a wet etch, such as molybdenum.

Printing of the gate metal precursor may include ink-jetting, screen printing, gravure printing, offset lithography (or offset printing), flexography (flexographic printing), spray-coating, slit coating, extrusion coating, meniscus coating, microspotting, pen-coating, stenciling, stamping, syringe dispensing and/or pump dispensing the metal-containing ink in a predefined pattern. Furthermore, patterning the gate metal may include coating the gate metal precursor (or printing using relatively low-resolution printing, such as inkjetting) and locally exposing it to laser radiation such that the radiated portion changes its solubility characteristics in the exposed areas. Upon washing away the exposed or unexposed area (depending on whether the precursor is a positive or negative patternable material), the irradiated gate metal precursor stays behind to form the gate metal, optionally after an additional curing or annealing step. This embodiment may provide advantages for the patterning of high-resolution metal gates which may not directly be achievable with direct printing methods.

The printed metal-containing ink may be dried by conventional and/or otherwise known processes. For example, metal precursor inks may be dried by heating the substrate containing the printed metal precursor ink thereon at a temperature and for a length of time effective to remove the solvent and/or binder. Suitable temperatures for removing solvents from a printed ink may range from about 80° C. to about 150° C., or any range of temperatures therein (e.g., from about 100° C. to about 120° C.). Suitable lengths of time for removing solvents from a printed ink at such temperatures may ranges from about 10 seconds to about 10 minutes, or any range of times therein (e.g., from about 30 seconds to about 5 minutes, or about 1 minute to 3 minutes, etc.). Such heating may take place on a conventional hotplate or in a conventional furnace or oven, optionally in an inert atmosphere (as described above).

The dried metal-containing material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying gate oxide. When the metal-containing ink is globally (blanket) deposited or printed, annealing is generally conducted to form a metal film on which a resist is deposited for subsequent laser patterning. Also, when laser direct-writing a metal precursor ink results in a patterned metal and/or metal precursor, annealing is generally performed to form a metal layer with one or more improved properties (e.g., conductivity, adhesion, film morphology, etc.) relative to an otherwise identical layer that has not been so annealed. Such annealing may comprise either annealing already-fused metal nanoparticles, or converting a patterned metal precursor layer into a patterned metal as described above. Suitable temperatures generally range from about 100° C. to about 300° C., or any range of temperatures therein (e.g., from about 150° C. to about 250° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, and optionally in an inert or reducing atmosphere. Thus, the present method may further comprise the step of annealing the laser patterned metal gate sufficiently to improve its electrical, physical and/or adhesive properties.

In various embodiments, the gate has a width of at least 0.1 microns, 0.5 microns, 1 micron, or 2 microns. In one implementation, the minimum gate width is about 5 microns. The gate may have a length of from about 1 µm to about 1000 µm or any range of values therein (e.g., from about 2 µm to about 200 µm, or from about 5 µm to about 100 µm, etc.), and a thickness of from about 50 nm to about 10,000 nm or any range of values therein (e.g., from about 100 to about 5000 nm, or from about 200 to about 2000 nm, etc.).

Thereafter, the exposed portions of the gate dielectric layer 30 are etched (preferably by conventional wet etching) to form a recess under the edge of gate 40, yielding the recessed dielectric layer 35 of FIG. 3. A number of etch methods can be used to etch back the material of the gate dielectric layer 30, depending on the target distance that the material is to be etched away from the gate edge. For example, a small etch back (generally in which the recess under the gate edge is smaller than or equal to 5% to 10% of the gate length, depending on the gate length, process tolerances and other parameters) can be performed in a conventional plasma etcher. Larger etch backs can be performed with high pressure, fluorine-containing plasma etching. Depending on the choice of gate dielectric material, a wet etchant can be used to etch the exposed gate dielectric and etch it back slightly (on the order of 5% to 10% of the gate length under each gate edge), thereby forming recessed dielectric layer 35. For example, when the gate dielectric layer 30 comprises doped or undoped $SiO_2$, an HF-based wet etchant can be used (for instance, a dilute solution of HF [e.g., 0.1-10% by volume of conc. HF in deionized water] which may be buffered with, e.g., $NH_3$ or its equivalent). Alternatively, when the gate dielectric layer 30 comprises silicon nitride, a concentrated aqueous $H_3PO_4$ wet etchant can be used.

The dielectric material of layer 50 in the resulting structure is approximately of the same thickness as the material of the recessed gate dielectric layer 35 between gate 40 and channel 20. This effectively reduces the gate control on the channel 20 in the edge region, limiting the effect of the gate 40 on the drain-to-channel and source-to-channel junctions. The scale of this effect is determined by the difference in dielectric constant between the two dielectric materials, as well as the distance that the recessed gate dielectric layer 35 is recessed under the gate 40.

Dopant layer 50 is then deposited such that it fills the recess left by etching back the gate dielectric layer 35 under the gate

Figure 5:
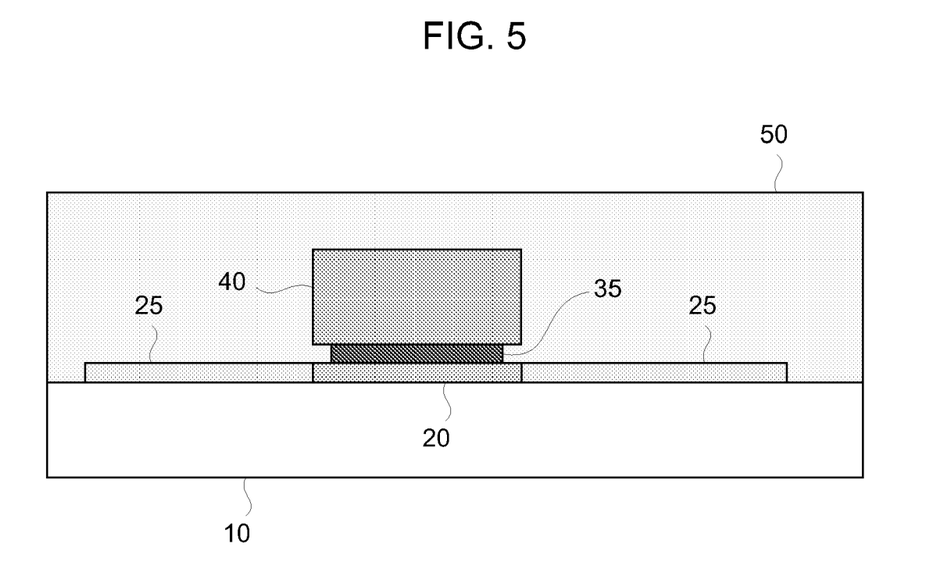

40, thereby yielding the structure of FIG. 5. Dopant layer 50 typically comprises a doped dielectric, such as a conventional spin-on dopant formulation. When formulated as an ink, the dopant layer can be printed onto the structure of FIG. 3 using the above-described printing processes (preferably using a low resolution process such as inkjetting). Suitable formulations for inkjetting dopant layer 50 are described in U.S. Provisional Appl. No. 60/926,125, filed Apr. 24, 2007, the relevant portions of which are incorporated herein by reference. For example, the ink formulation may comprise a phosphosilicate (P-silicate) polymer (N+) or borosilicate (B-silicate) polymer (P+) in an amount of 4-15% dopant mass loading in the ink, a high volatility solvent, and a low volatility solvent. Examples of low volatility solvents include $C_5$-$C_{10}$ mono- or polyalcohols, such as butyl carbitol and tetrahydrofurfuryl alcohol (THFA). Optimally, the low volatility solvent comprises 5-30 wt % (preferably 10-30 wt %) of the ink. Examples of high volatility solvents include $C_1$-$C_4$ monoalcohols, such as MeOH, EtOH, and i-PrOH, and $C_1$-$C_4$ esters of $C_1$-$C_4$ monocarboxylic acids, such as ethyl acetate, etc. Optimally, the high volatility solvent comprises 50-90 wt % (preferably 50-85 wt %) of the ink. For further stability of the inkjetting formulation, it is preferable that ink does not contain a monomer or oligomer of an alkoxide such as tetraethyl orthosilicate (TEOS). In one embodiment, the dielectric constant (k) of the dopant material of layer 50 is lower than that of the material of the gate dielectric layer 30.

After printing the ink, the solvent may be evaporated (e.g., by heating to a temperature of from 30° C. to 70° C., optionally at a temperature that provides an evaporation rate sufficient to control spreading of the dopant material on the substrate 10). The dopant layer 50 is then annealed to diffuse the dopant from the ink formulation into the semiconductor channel layer 20 to obtain source/drain terminals 25. Where the gate metal and substrate are sufficiently thermally tolerant, annealing may comprise heating in a furnace at a temperature of from 600 to 1000° C. (preferably between 800-850° C.) for a length of time (e.g., from 10 minutes to 2 hours) sufficient to drive the dopant into the underlying channel layer 20 and activate the dopant (i.e., to form source and drain terminals 25), and when the gate 40 comprises and Group IVA semiconductor such as silicon, into the gate 40. Where the substrate 10 and/or gate 40 is less thermally tolerant, suitable annealing conditions (e.g., temperature and length of time) for diffusing the dopant into channel layer 20 can be empirically determined by one skilled in the art, and the dopant can be activated by, e.g., irradiating the source and drain regions 25 with a suitable wavelength, energy and pulse width of laser radiation sufficient to activate at least part (and preferably, substantially all) of the dopant.

Figure 6:
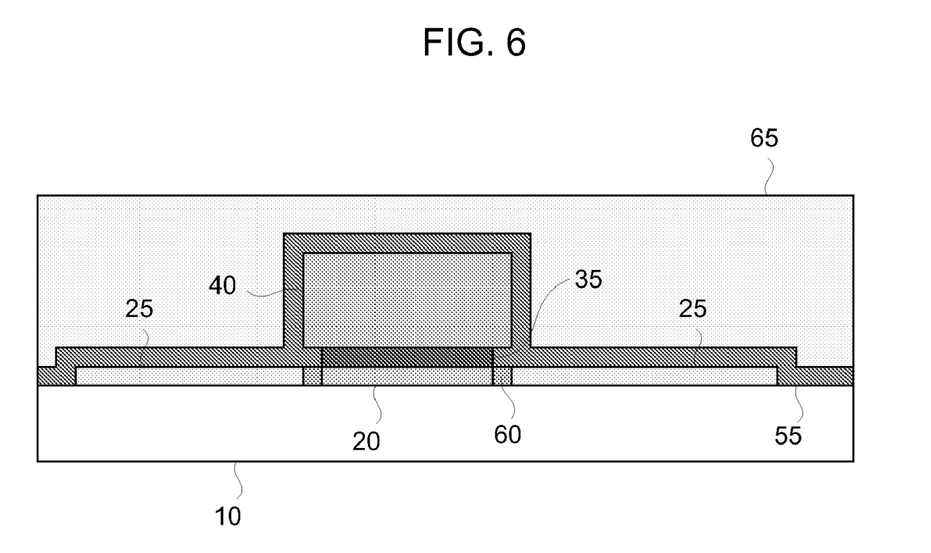
FIG. 6 illustrates a modification of the doped oxide source/drain dopant scheme, wherein an undoped or lightly doped layer 50 is used to fill the gap under the gate 10.

In an alternative embodiment, as illustrated in FIG. 6, a first dielectric layer 55 can fill the undercut space. Preferably, the undercut space is less than or equal to 10% of the gate length. The undercut region can be formed, for example, by wet etching the gate dielectric layer as described above. In addition, in such an embodiment, the gate can comprise a material (such as Mo) that is not significantly etched under the wet etching conditions.

Figure 7:
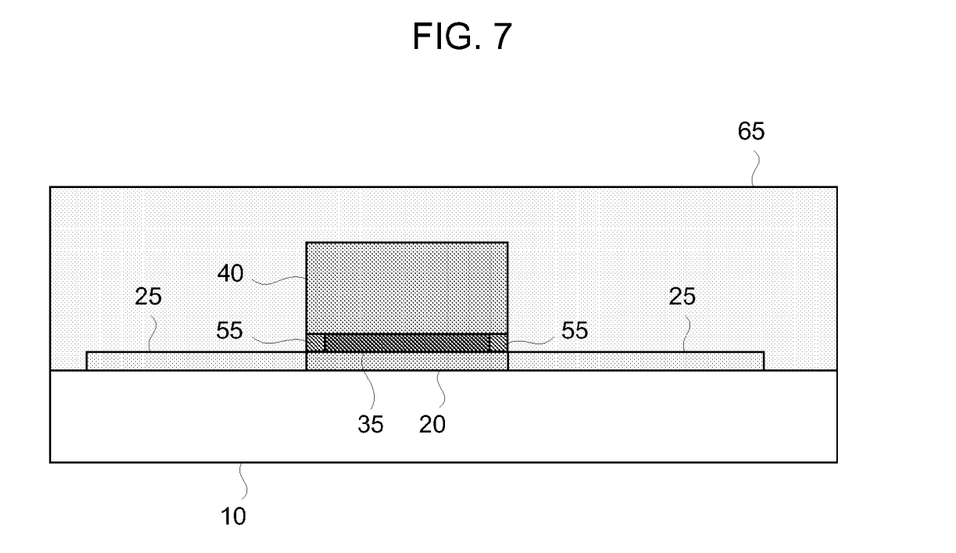
FIG. 7 illustrates an exemplary TFT according to the present methods.

The first dielectric layer 55 may be formed by chemical vapor deposition. Alternatively, the first dielectric layer 55 may be formed by spin-on depositing a precursor, then converting the precursor to the first dielectric layer 55 using the solvent evaporation technique described above for dopant layer 50. The precursor can comprise a spin-on glass having wetting characteristics sufficient to form a fillet (or tip) at the base of the gate (e.g., under the edge of the gate, and preferably in contact with gate dielectric layer 35). The first dielectric layer 55 may also comprise a lightly doped dielectric layer. In this case, the method can also comprise forming a heavily doped dielectric layer 65 over or in contact with the lightly doped dielectric layer. Additionally, as shown in FIG. 7, the method may further comprise removing the exposed first dielectric layer 55 (preferably such that the fillets remain under the edges of the gate 40), then forming a heavily doped dielectric layer 65 over or in contact with the gate 40 and the regions of channel layer 20 that subsequently form the source and drain terminals 25 after dopant diffusion (e.g., annealing).

Suitable low dielectric constant materials for layer 55 include doped and undoped $SiO_2$ and polyimides, which are generally characterized by dielectric constants even lower than that of $SiO_2$. With a polyimide as the low dielectric constant material, $SiO_2$ can be the high dielectric constant material for gate dielectric 35, whereas the polyimide can be the low dielectric constant material 55 under the gate edge.

Many additional material combinations may be useful. For example, suitable high dielectric constant materials such as $Al_2O_3$ and $HfO_x$ (where $1 \leq x \leq 2$) can be used. These materials may be used alone or in combination with an underlying $SiO_2$ layer. The fact that the combined dielectric material stack has a net dielectric constant higher than the edges still provides a useful effect. Also, materials capable of being wet etched can be used.

Also, as illustrated in FIG. 6, the device of the present invention is effective in the case where the source/drain regions 25 are implanted and the first dielectric layer 55 is undoped. More particularly, FIG. 6 illustrates a modification of a doped oxide source/drain dopant scheme. If a first undoped or lightly doped glass 55 is used to fill the gap under the gate 40, then the level of doping in the region 60 near that material will be lower. If the material is thin compared to the gate undercut distance, then the subsequently deposited high concentration doped material 65 will move through the thin region over the source/drain regions (e.g., 25), but not as fast into the tip regions 60 due to the longer diffusion distance between the highly doped material 50 and the channel area under the gate edge. This provides the effect of a lightly doped drain (LDD). If the undoped or lightly doped material 55 has a lower dielectric constant than the original (or etched-away) gate insulator, then a limiting of the effect of the gate 40 on the drain-to-channel and source-to-channel junctions may be observed.

In fact, etching an undercut under the gate 40 may not be necessary to obtain the tip extension (or LDD) effect. A lightly doped spin-on glass (SOG) material having wetting characteristics sufficient to form a fillet at the base of the gate conductor 40 can simply be selected and deposited before adding a heavily doped dielectric layer 65 above it.

The semiconductor structures of the present invention may be incorporated into devices such as radio frequency identification (RFID) tags, high frequency (HF) devices, ultrahigh frequency (UHF) devices, etc., all of which employ circuitry for signal modulation, signal demodulation, rectification, clock generation and/or recovery, logic/signal processing, and/or memory. Alternatively, because the invention can be made using an "all-printed" process (i.e., in which substantially all materials are deposited by printing), TFTs can be formed and employed in electrical circuits printed onto a flexible substrate 10.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for making source/drain tip extensions in a thin film transistor (TFT), comprising the steps of:
   a) forming a first dielectric layer adjacent to and in contact with a gate stack and in contact with regions for forming source and drain terminals of the TFT, the gate stack having a gate dielectric layer and a gate electrode, wherein the gate dielectric is between the gate electrode and a channel region of the TFT, and the first dielectric layer has a dopant therein; and
   b) heating the first dielectric layer, the gate stack, and the regions for forming source and drain terminals sufficiently to diffuse an amount of the dopant from the first dielectric layer into the channel region effective to form electrically functional source/drain extensions.

2. The method of claim 1, wherein said gate dielectric layer is recessed under the gate.

3. The method of claim 2, further comprising etching said gate dielectric layer to form an undercut space between an outer edge region of the gate and the channel region.

4. The method of claim 3, wherein said first dielectric layer fills the undercut space.

5. The method of claim 3, wherein said undercut space is less than or equal to 10% of the gate length.

6. The method of claim 3, wherein said first dielectric layer fills the undercut space.

7. The method of claim 1, wherein said first dielectric layer has a dielectric constant (k) less than that of the gate dielectric layer.

8. The method of claim 7, wherein the gate dielectric layer is selected from the group consisting of silicon nitride, aluminum oxide, hafnium monoxide and/or hafnium dioxide.

9. The method of claim 7, wherein said first dielectric layer is selected from the group consisting of silicon dioxide doped with boron, silicon dioxide doped with phosphorous, and polyimides.

10. The method of claim 3, wherein said gate dielectric layer is wet etched to form said undercut region.

11. The method of claim 10, wherein said gate comprises a material that is not significantly etched under the wet etching conditions.

12. The method of claim 1, wherein forming said first dielectric layer comprises chemical vapor depositing said first dielectric layer.

13. The method of claim 1, wherein forming said first dielectric layer comprises spin-on depositing a precursor to said first dielectric layer, then converting said precursor to said first dielectric layer.

14. The method of claim 13, wherein said precursor comprises a spin-on glass having wetting characteristics sufficient to form a fillet at the base of the gate.

15. The method of claim 1, wherein said first dielectric layer comprises a lightly doped dielectric layer.

16. The method of claim 15, further comprising forming a heavily doped dielectric layer over or in contact with said lightly doped dielectric layer.

17. The method of claim 1, further comprising removing said first dielectric layer, then forming a heavily doped dielectric layer over or in contact with the gate and the source and drain terminals.

18. A method for making source/drain tip extensions in a thin film transistor (TFT), comprising the steps of:
   a) forming a first dielectric layer adjacent to a gate stack and over or in contact with regions for forming source and drain terminals of the TFT, the gate stack having a gate dielectric layer and a gate electrode, wherein the gate dielectric is between the gate electrode and a channel region of the TFT and is recessed under a bottommost surface of the gate electrode, and the first dielectric layer has a dopant therein; and
   b) heating the first dielectric layer, the gate stack, and the regions for forming source and drain terminals sufficiently to diffuse an amount of the dopant from the first dielectric layer into the channel region effective to form electrically functional source/drain extensions.

19. The method of claim 18, further comprising etching said gate dielectric layer to form an undercut space between an outer edge region of the gate and the channel region, prior to forming said first dielectric layer.

20. The method of claim 19, wherein said first dielectric layer fills the undercut space.

21. The method of claim 19, wherein said undercut space is less than or equal to 10% of the gate length.

22. The method of claim 19, wherein said gate dielectric layer is wet etched to form said undercut region.

23. The method of claim 22, wherein said gate comprises a material that is not significantly etched under the wet etching conditions.

24. The method of claim 18, wherein forming said first dielectric layer comprises chemical vapor depositing said first dielectric layer.

25. The method of claim 18, wherein forming said first dielectric layer comprises spin-on depositing a precursor to said first dielectric layer, then converting said precursor to said first dielectric layer.

26. The method of claim 25, wherein said precursor comprises a spin-on glass having wetting characteristics sufficient to form a fillet at the base of the gate.

27. The method of claim 18, wherein said first dielectric layer comprises a lightly doped dielectric layer.

28. The method of claim 27, further comprising forming a heavily doped dielectric layer over or in contact with said lightly doped dielectric layer.

29. The method of claim 18, further comprising removing said first dielectric layer, then forming a heavily doped dielectric layer over or in contact with the gate and the source and drain terminals.

30. The method of claim 18, wherein said first dielectric layer has a dielectric constant (k) less than that of the gate dielectric layer.

31. The method of claim 30, wherein the gate dielectric layer is selected from the group consisting of silicon nitride, aluminum oxide, hafnium monoxide and/or hafnium dioxide.

32. The method of claim 30, wherein said first dielectric layer is selected from the group consisting of silicon dioxide doped with boron, silicon dioxide doped with phosphorous, and polyimides.

* * * * *